(12) United States Patent
Lin et al.

(10) Patent No.: US 12,152,314 B2
(45) Date of Patent: *Nov. 26, 2024

(54) METHODS FOR DETERMINING SUITABILITY OF SILICON SUBSTRATES FOR EPITAXY

(71) Applicant: GlobalWafers Co., Ltd., Hsinchu (TW)

(72) Inventors: Shan-Hui Lin, Hsinchu (TW); Chun-Chin Tu, Zhubei (TW); Zheng Lu, O'Fallon, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 103 days.

This patent is subject to a terminal disclaimer.

(21) Appl. No.: 17/834,804

(22) Filed: Jun. 7, 2022

(65) Prior Publication Data

US 2022/0403548 A1 Dec. 22, 2022

Related U.S. Application Data

(60) Provisional application No. 63/213,457, filed on Jun. 22, 2021.

(51) Int. Cl.
| | | |
|---|---|---|
| *H01L 21/66* | (2006.01) | |
| *C30B 25/16* | (2006.01) | |
| *C30B 25/20* | (2006.01) | |
| *C30B 29/06* | (2006.01) | |
| *C30B 33/02* | (2006.01) | |

(Continued)

(52) U.S. Cl.
CPC .............. *C30B 25/16* (2013.01); *C30B 25/20* (2013.01); *C30B 29/06* (2013.01); *C30B 33/02* (2013.01); *H01L 22/12* (2013.01); *G01N 2021/217* (2013.01); *G01N 2021/8461* (2013.01); *H01L 21/02381* (2013.01); *H01L 21/02532* (2013.01);

(Continued)

(58) Field of Classification Search
None
See application file for complete search history.

(56) References Cited

U.S. PATENT DOCUMENTS

| | | |
|---|---|---|
| 6,825,487 B2 | 11/2004 | Preece |
| 7,828,893 B2 | 11/2010 | Mueller et al. |

(Continued)

FOREIGN PATENT DOCUMENTS

| | | |
|---|---|---|
| DE | 102019210254 A1 | 1/2021 |
| JP | 2003142545 A | 5/2003 |

OTHER PUBLICATIONS

Geiler H D et al: "Detection and analysis of crystal defects in silicon by scanning infrared depolarization and photoluminescence heterodyne techniques", Materials Science and Engineering: B, Elsvier, Amsterdam, NL, vol. 91-92, Apr. 30, 2002 (Apr. 30, 2002), pp. 46-50.

(Continued)

*Primary Examiner* — Jack S Chen
(74) *Attorney, Agent, or Firm* — Armstrong Teasdale LLP (57) ABSTRACT

Methods for determining suitability of a silicon substrate for epitaxy and/or for determining slip resistance during epitaxy and post-epitaxy thermal treatment are disclosed. The methods involve evaluating different substrates of the epitaxial wafers by imaging the wafer by infrared depolarization. An infrared depolarization parameter is generated for each epitaxial wafer. The parameters may be compared to determine which substrates are well-suited for epitaxial and/or post-epi heat treatments.

11 Claims, 7 Drawing Sheets

(51) Int. Cl.
  *G01N 21/21* (2006.01)
  *G01N 21/84* (2006.01)
  *H01L 21/02* (2006.01)

(52) U.S. Cl.
  CPC .. *H01L 21/02634* (2013.01); *H01L 21/02664* (2013.01)

(56) References Cited

U.S. PATENT DOCUMENTS

| | | |
|---|---|---|
| 7,838,398 B2 | 11/2010 | Schauer et al. |
| 9,005,563 B2 | 4/2015 | von Ammon et al. |
| 9,240,316 B2 | 1/2016 | Schauer et al. |
| 2004/0021097 A1 | 2/2004 | Preece |
| 2010/0003811 A1 | 1/2010 | Wada |
| 2022/0403549 A1* | 12/2022 | Lu .......................... C30B 15/20 |

OTHER PUBLICATIONS

User Manual, SIRD—A V411, Scanning Infrared Depolarization, PVA TePla AG, Division Plasma Systems, Germany, May 15, 2007, 144 pages.

\* cited by examiner

METHODS FOR DETERMINING SUITABILITY OF SILICON SUBSTRATES FOR EPITAXY

CROSS-REFERENCE TO RELATED APPLICATION

This application claims the benefit of U.S. Provisional Patent Application No. 63/213,457, filed Jun. 22, 2021, which is incorporated herein by reference in its entirety.

FIELD OF THE DISCLOSURE

The field of the disclosure relates to methods for determining suitability of silicon substrates for epitaxy and, in particular, for determining slip resistance during epitaxy and post-epitaxy thermal treatment.

BACKGROUND

During epitaxial wafer production and during post-epi thermal cycles, slips are often generated. Slip resistance has become an increasingly important capability in advanced integrated circuit fabrication technology. Conventional methods for detecting slip resistance are destructive processes in which the wafer is not preserved for further use. For example, wafers may be stressed in an anneal furnace and the bow of the wafers may be measured as an indicator of wafer strength. Further, conventional processes are not able to evaluate different epitaxial substrates for slip resistance under different epitaxial and post-epi treatments.

A need exists for a reliable and nondestructive processes capable of quantitively evaluating and comparing different substrates for their slip resistance under various epitaxial processes and thermal treatments.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for determining suitability of a silicon substrate for epitaxy. A first silicon substrate is loaded onto a susceptor disposed within a processing reactor. A front surface of the first silicon substrate is contacted with a silicon-containing gas. The silicon-containing gas decomposes to form an epitaxial silicon layer on the first silicon substrate to form a first epitaxial wafer. The first epitaxial wafer is imaged by infrared depolarization to determine a first infrared depolarization parameter. A second silicon substrate is loaded onto the susceptor disposed within the processing reactor. The second silicon substrate has a different composition than the first silicon substrate. A front surface of the second silicon substrate is contacted with a silicon-containing gas. The silicon-containing gas decomposes to form an epitaxial silicon layer on the second silicon substrate to form a second epitaxial wafer. The second epitaxial wafer is imaged by infrared depolarization to determine a second infrared depolarization parameter. Suitability of the first and second substrates for epitaxy is determined based on the first and second infrared depolarization parameters.

Yet another aspect of the present disclosure is directed to a method for determining suitability of a silicon substrate for epitaxy. A silicon substrate is loaded onto a susceptor disposed within a processing reactor. A front surface of the silicon substrate is contacted with a silicon-containing gas. The silicon-containing gas decomposes to form an epitaxial silicon layer on the silicon substrate to form an epitaxial wafer. Only an annular edge region of the epitaxial wafer is imaged by infrared depolarization to determine an infrared depolarization parameter.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for determining suitability of silicon substrates for epitaxy, such as by determining the slip resistance of the substrate during epitaxial layer deposition and/or post-epi thermal treatments. In some embodiments, the composition of the substrate material is varied and the resulting epitaxial wafers are imaged by infrared depolarization. Imaging results in one or more infrared depolarization parameters being produced for each imaged wafer. The parameter may be used to determine suitability of the silicon substrate for epitaxy (e.g., slip resistance).

Figure 1:
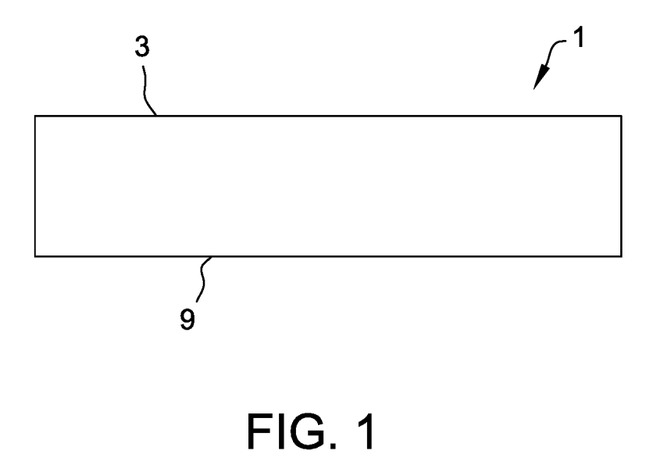
FIG. 1 is a cross-section view of a semiconductor substrate for producing an epitaxial wafer.
Figure 2:
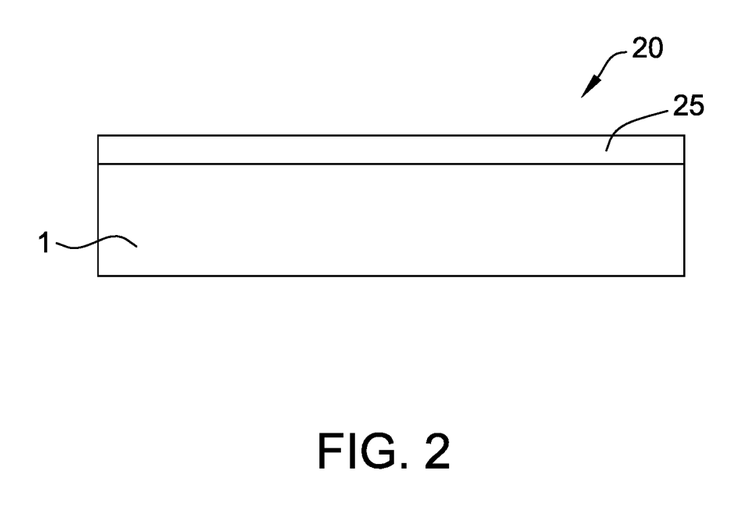
FIG. 2 is a cross-section view of an epitaxial wafer.

Referring now to FIG. 1, a substrate 1 for use in preparing an epitaxial wafer 20 (FIG. 2) is shown. The substrate 1 may be a single crystal silicon wafer, such as a wafer produced by the so-called Czochralski method. The substrate 1 has a front surface 3 and a back surface 9. Substrates 1 tested for suitability e.g., for slip resistance) for use in epitaxial wafers and post-epi processes may have variable impurity concentrations (e.g., nitrogen or oxygen) and/or variable dopant concentrations (e.g., boron) as further described below.

Figure 3:
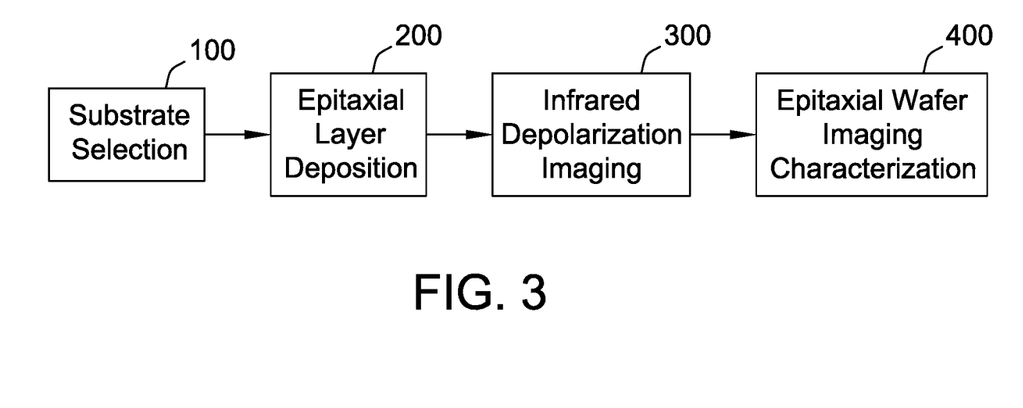
FIG. 3 is a flow chart of an embodiment of a method for determining suitability of a silicon substrate for epitaxy.
Figure 5:
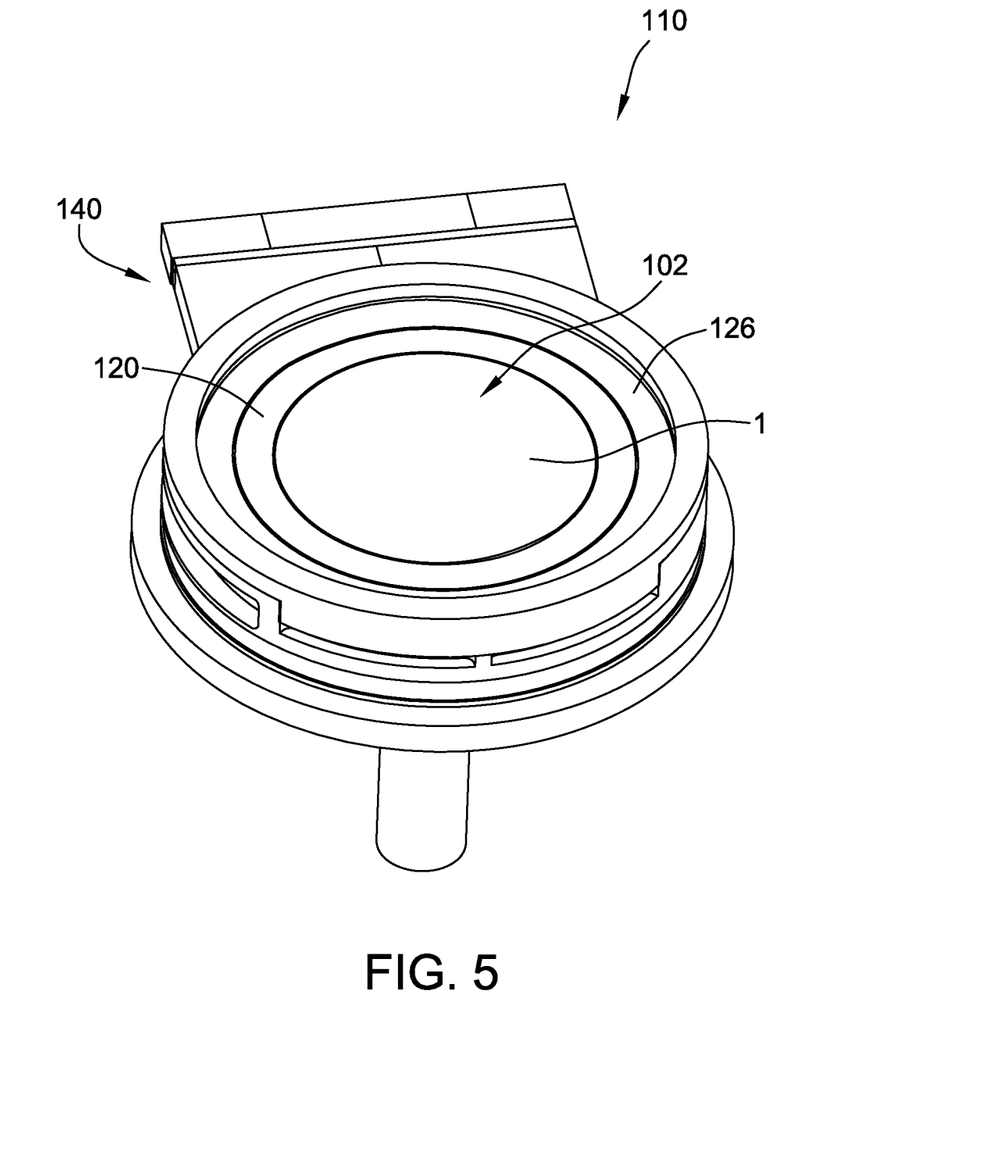
FIG. 5 is a perspective view of a processing reactor for depositing an epitaxial layer on a substrate with a cover of the reactor removed.

Once the wafer 1 has been selected (e.g., in a first step 100 (FIG. 3)) the wafer 1 may be processed (e.g., sliced from an ingot followed by various steps of smoothing and/or reduction in surface roughness). In a second step 200, an epitaxial layer 25 (FIG. 2) is deposited on the front surface 3 (FIG. 1) of the substrate 1 by contacting the front surface 3 with a silicon-containing gas that decomposes and forms an epitaxial silicon layer 25 on the substrate 1. Generally, any of the methods available to those of skill in the art for depositing a silicon epitaxial layer on a silicon substrate may be used unless stated otherwise. For example, the epitaxial layer 25 may be deposited in the example processing reactor 110 shown in FIG. 5. The reactor 110 includes a processing chamber 102 in which a single semiconductor is etched. A gas manifold 140 is used to direct incoming gas into the processing chamber 102. The incoming process gas flows through the gas manifold 140 and into the processing chamber 102 and is discharged through a gas discharge port. The reactor 110 includes a susceptor 120 disposed within the processing chamber 102 for supporting the substrate 1. A preheat ring 126 surrounds the susceptor 120 to bring process gasses up to temperature before contacting the substrate 1. The substrate 1 is rotated to evenly deposit the epitaxial layer onto the substrate 1.

Silicon may be deposited by epitaxy to any suitable thickness depending on the device application. For example, the silicon may be deposited using metalorganic chemical vapor deposition (MOCVD), physical vapor deposition (PVD), chemical vapor deposition (CVD), low pressure chemical vapor deposition (LPCVD), plasma enhanced chemical vapor deposition (PECVD), atmospheric pressure chemical vapor deposition (APCVD), reduced pressure chemical vapor deposition (RPCVD), or molecular beam epitaxy (MBE). Silicon precursors (i.e., silicon-containing gases) for LPCVD or PECVD include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. For example, silicon may be deposited by pyrolyzing silane ($SiH_4$) in a temperature range between about 550° C. and about 690° C., such as between about 580° C. and about 650° C. The chamber pressure may range from about 70 to about 400 mTorr.

In some embodiments, a boron-containing gas is introduced into the reactor 110 to dope the epitaxial layer with boron. For example, $B_2H_6$ may be added to the deposition gas. The mole fraction of $B_2H_6$ in the atmosphere used to obtain the desired properties (e.g., resistivity) will depend on several factors, such as the amount of boron out-diffusion from the particular substrate during the epitaxial deposition, the quantity of p-type dopants and n-type dopants that are present in the reactor and substrate as contaminants, and the reactor pressure and temperature.

Once the epitaxial layer 25 is deposited, the epitaxial wafer 20 (which may be referred to herein as a "first" epitaxial wafer) may be imaged by infrared depolarization (step 300 shown in FIG. 3) to determine an infrared depolarization parameter of the wafer 20. The epitaxial wafer 20 may be imaged directly after deposition of the layer or one or more post-epi processes may be performed (e.g., cleaning). Infrared depolarization imaging may be performed on commercially available inspection tools such as the SIRD (Scanning Infrared Depolarization) system sold by PVA TePla America, Inc. (Corona, CA) or the PSI system available from Semilab Semiconductor Physics Laboratory Co., Ltd. (Budapest, Hungary).

Figure 6:
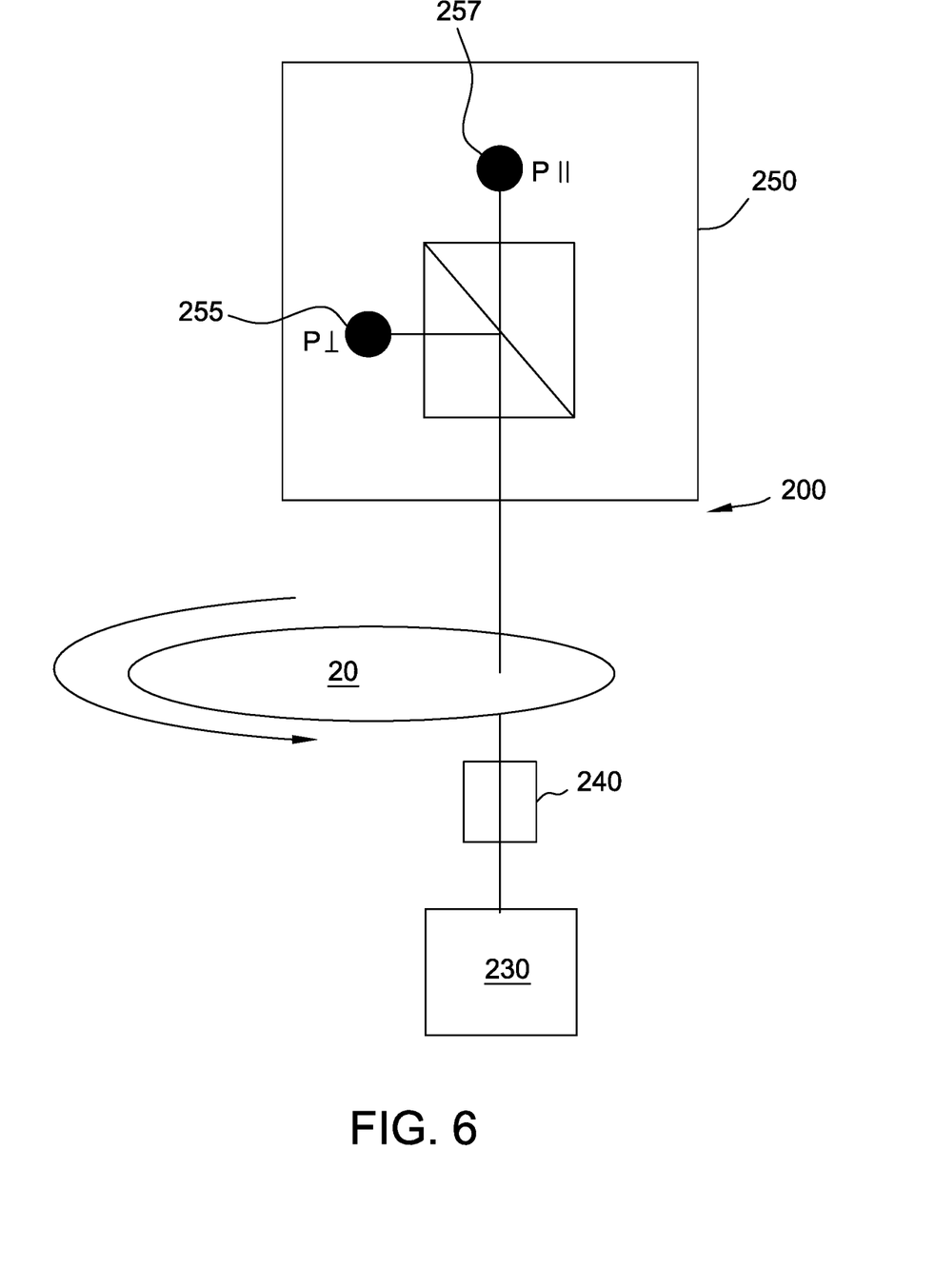
FIG. 6 is a schematic view of an apparatus for imaging epitaxial wafers by infrared depolarization.

An example apparatus 200 for imaging epitaxial wafers 20 is shown in FIG. 6. A laser 230 transmits light through a polarizer 240. The linearly polarized light (e.g., wavelength of about 1.3 µm) penetrates the wafer 20 generally perpendicularly to its surface. While the illustrated apparatus 200 directs light through the back surface of the wafer 20, in other embodiments the a pparatus 200 directs light through the front surface. The wafe 20 is rotated while being scanned.

An analyzer 250 measures the linear state of the light that passes through the wafer 20. The analyzer 250 measures the power of the parallel ($P_{\|}$) and perpendicular ($P^{\wedge}$) electromagnetic field components by diodes 255, 257. Without being bound by any particular theory, it is believed that resident stress fields in the wafer 20 change the polarization state due to stress induced birefringence. Depolarization may be linearly correlated with the local stress in the volume penetrated by the laser light.

Depolarization may be measured as follows:

$$D = 1 - \frac{P_{\|} - P_{\perp}}{P_{\|} + P_{\perp}}. \quad (1)$$

Depolarization (D) is a dimensionless value and ranges from 0 to 2. When depolarization (D) approaches zero, little or no birefringence is observed indicating no stress at the imaged wafer site. When depolarization (D) approaches one, circular polarization is present. When depolarization (D) approaches two, a half-plate is indicated (full shift in polarization). Depolarization (D) may be expressed in depolarization units (DU) in which one $DU = 10^{-6} * D$. In some embodiments, a global stress defined by the depolarization contrast (DC) may be used:

$$DC = \frac{D_{max} - D_{min}}{\sqrt{D_o}}. \quad (2)$$

In some embodiments, a shear stress equivalent (G) may be determined (see pages 33-39 of the PVA TePla SIRD User Manual (2007)—the User Manual being incorporated herein by reference for all relevant and consistent purposes).

Depolarization may be measured in "tracks" of the scanned surface with each track having a number of "track points" within the track at which depolarization is measured (see page 32 of the PVA TePla SIRD User Manual (2007) which is incorporated by referenced herein). An average may be established for each track and the percentage of track points which deviate from the average may be recorded (i.e., "bad fraction"). The bad fraction of track points may be based on a minimum deviation from the average depolarization of the track (±20% of the average or ±30%, ±40%, or ±50% of the average). Resolution may be adjusted by changing the number of track points measured within a track and by the track separation.

Figure 7:
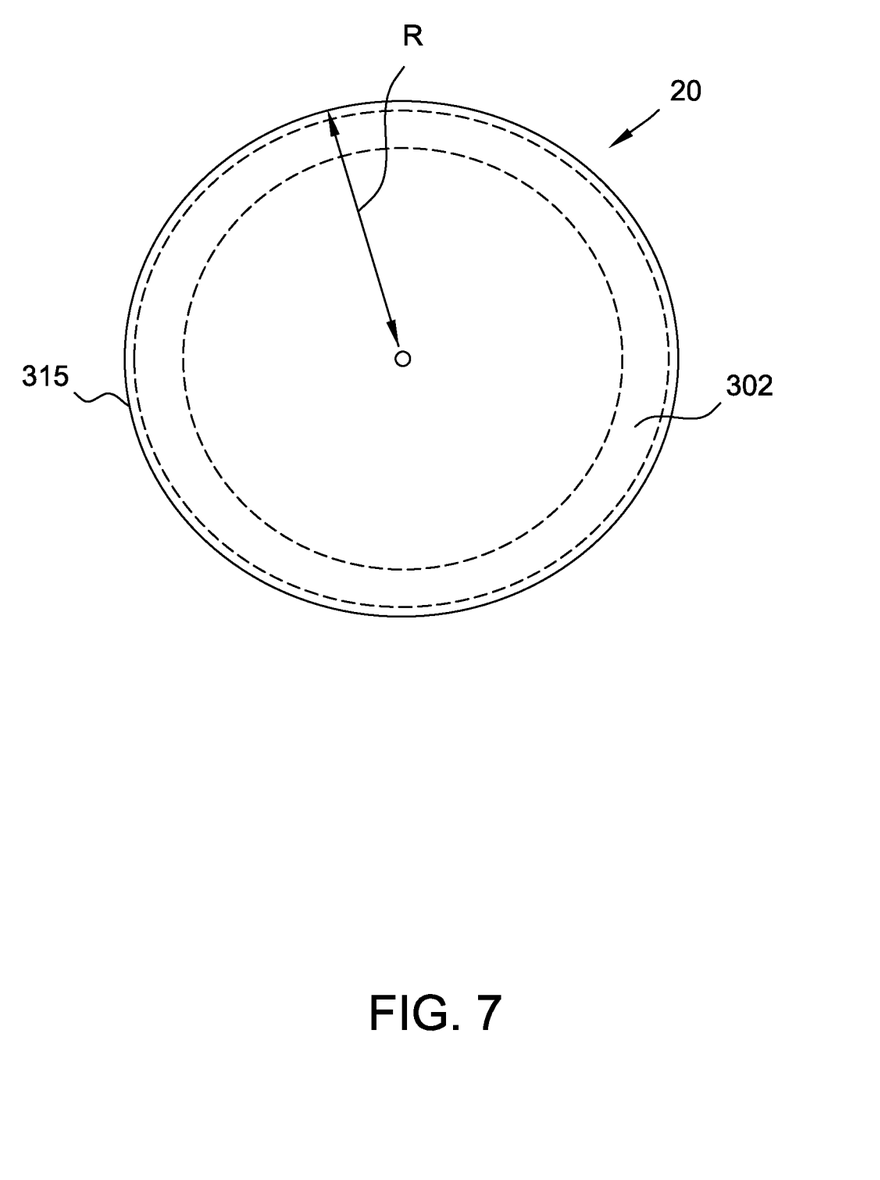
FIG. 7 is a top view of an epitaxial wafer showing an annular edge ring which is imaged by infrared depolarization.

Referring now to FIG. 7, in some embodiments of the present disclosure, only an annular edge region 302 of the epitaxial wafer 20 is imaged by infrared depolarization to determine the infrared depolarization parameter. For example, the annular edge region 302 may extend from at least about 85% of the radius R of the epitaxial wafer 20 and toward the circumferential edge 315. In other embodiments, the annular edge region 302 extends from at least about 90% or at least about 95% of the radius R of the epitaxial wafer and toward the circumferential edge 315. The annular edge region 302 may terminate at the circumferential edge 315 or before the edge 315. For example, the annular edge region may extend to 99.5% of the radius R or even 99.9% of the radius R. In other embodiments, rather than imaging the wafer 20 in only an annular edge region, the entire wafer is imaged (optionally with an edge exclusion area not being imaged).

Figure 4:
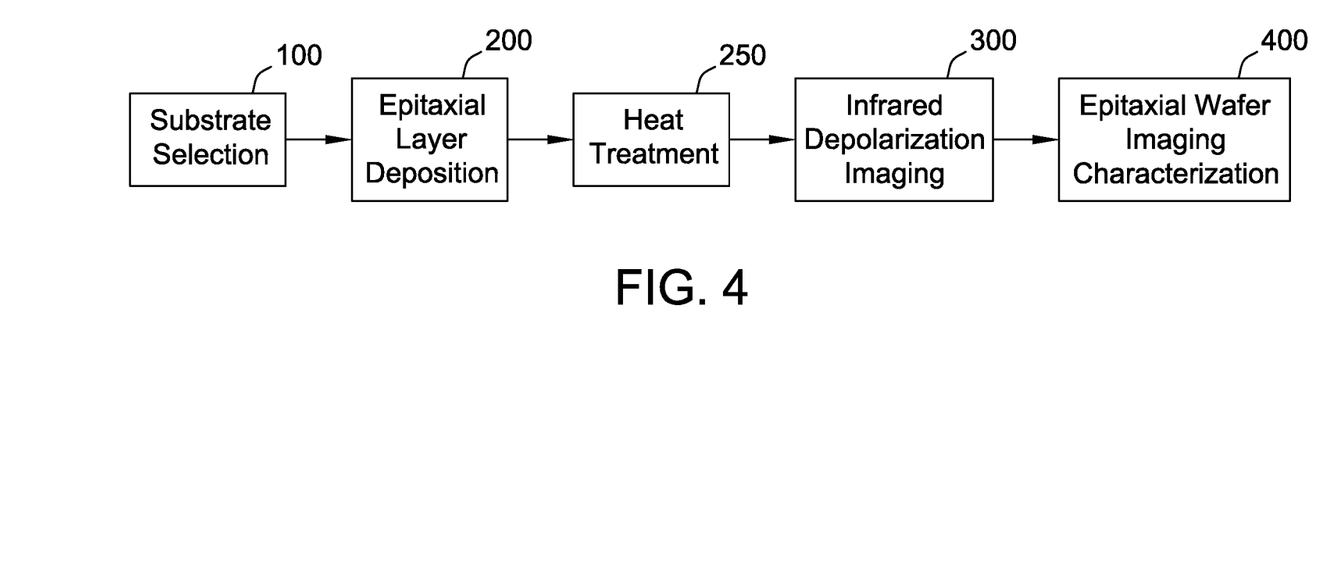
FIG. 4 is a flow chart of another embodiment of a method for determining suitability of a silicon substrate for epitaxy.

The infrared depolarization parameter of the wafer 20 may generally be any parameter based on a characterization of the wafer imaging (step 400 of FIG. 4). For example, the infrared depolarization parameter may be a wafer map (e.g., an image of the wafer showing defects, stress points, bad fraction track points or other characteristics of the scan). Alternatively or in addition, the parameter may be related to the "bad fraction" of track points (e.g., a bad fraction variability chart, a bad fraction average or the total bad fraction). Alternatively or in addition, the parameter may be related to the depolarization value (e.g., average depolarization value or total depolarization value), the depolarization contrast or the shear stress equivalent.

Once the infrared depolarization parameter is determined, suitability of the substrate for use in epitaxy may be determined. For example, the parameter may be compared to a threshold parameter and/or it may be determined whether the parameter falls within a threshold range.

In some embodiments of the present disclosure, two or more epitaxial wafers are imaged by infrared depolarization and their respective infrared depolarization parameters are compared to determine suitability of the epitaxial wafers (and particularly substrates thereof) for epitaxy (e.g., strength and/or slip resistance and optionally after downstream heat treatments). For example, first and second epitaxial wafers may be imaged and their infrared depolarization parameters compared to determine which of the substrates is more suitable for epitaxy. A first silicon substrate is loaded onto the susceptor 120 (FIG. 5) disposed within a processing reactor 110. The front surface of the first silicon substrate is contacted with a silicon-containing gas which decomposes to form an epitaxial silicon layer on the first silicon substrate to form a first epitaxial wafer. The first epitaxial wafer is imaged by infrared depolarization to determine a first infrared depolarization parameter.

A second silicon substrate is also loaded onto the susceptor 120 (FIG. 5) that is disposed within the processing reactor 110. The second silicon substrate has a different composition than the first silicon substrate. A front surface of the second silicon substrate is contacted with the silicon-containing gas which decomposes to form an epitaxial silicon layer on the second silicon substrate to form a second epitaxial wafer. The second epitaxial wafer is imaged by infrared depolarization to determine a second infrared depolarization parameter.

In accordance with embodiments of the present disclosure, suitability of the first and second substrates for epitaxy may be determined based on the first and second infrared depolarization parameters. For example, the first infrared depolarization parameter may be compared to the second infrared depolarization parameter to determine suitability of the first and/or second silicon substrate for epitaxy. Alternatively or in addition, the first and second infrared depolarization parameter may be compared to a threshold parameter (e.g., a parameter in which the slip resistance of the substrate is known to be acceptable). Such threshold parameters may be determined by determining the infrared depolarization parameter of substrates which are known or found to have acceptable slip resistance in epitaxy. In accordance with embodiments of the present disclosure, the first infrared depolarization parameter and the second infrared depolarization parameter are the same parameter.

As noted above, the substrates of the first and second epitaxial wafers may have a different composition to determine which types of substrates are well-suited for epitaxy (e.g., slip resistance). For example, the first and second silicon substrates may have a different impurity concentration or dopant concentration. For example, the first and second silicon substrates may have different concentrations of oxygen, oxygen precipitation, nitrogen, carbon or boron or other dopants. The desired concentration of oxygen, oxygen precipitation, nitrogen, carbon and/or boron or other dopants may be varied by controlling the Czochralski process in which an ingot from which the substrate is sliced is pulled from a silicon melt.

In some embodiments, three, four, five or more epitaxial wafers are imaged by infrared depolarization with each of the substrates having a different composition. The infrared depolarization parameters of the wafers are compared to determine which substrates are well-suited for epitaxy (e.g., slip resistance). In embodiments in which two or more epitaxial wafers are imaged, the epitaxial silicon layers may be formed on each of the silicon substrates under the same process conditions (e.g., process times and temperatures). Use of the same or similar process conditions reduces the influence of the process conditions in the slip performance when comparing wafers.

Referring now to FIG. 4, in some embodiments, after the epitaxial layer is deposited in step 200 and before imaging 300, the wafer may undergo a heat treatment step 250 (e.g., both wafers are heat treated under the same conditions when more than one wafers are imaged). The heat treatment step 250 may mimic a heat treatment used during downstream device fabrication. For example, the heat treatment may involve heating up to 1150° C. for six or more hours.

Compared to conventional methods for determining suitability of a silicon substrate for epitaxy, the methods of the present disclosure have several advantages. The methods are capable of quantitatively characterizing and comparing the slip performance under different epitaxial processes and post-epi thermal treatments when evaluating various types of substrates. The characterization processes are consistent for each tested wafer. The methods are non-destructive which allows the tested wafers to be used commercially after imaging and characterization. In embodiments in which only an edge region of the semiconductor structure is imaged, the epitaxial wafer may be scanned relatively quickly and/or a sharper resolution may be used without an increase in imaging time. Imaging of the edge region is representative of wafer strength as it has been found that the high temperature epi process imposes thermal shock with internal stress fields being present predominantly at the wafer edge. Infrared depolarization is capable of detecting internal stress unlike other methods (e.g., surface scan and XRT) and is characterized by higher sensitivity than other methods. Conventional methods (e.g., XRT) generate only wafer maps and are not quantitative.

EXAMPLES

The processes of the present disclosure are further illustrated by the following Examples. These Examples should not be viewed in a limiting sense.

Example 1

Imaging of Wafers by Infrared Depolarization to Determine Slip Resistance

Epitaxial wafers (300 mm) were imaged by infrared depolarization (~1.3 μm) on a SIRD apparatus (PVA TePla America, Inc. (Corona, CA)). The substrates of each of the epitaxial wafers was boron doped. An annular edge region of each wafer from 144 mm to 149 mm (0.96% to 99.3% of the radius) was scanned.

Epitaxial Wafer C was boron doped to a p+ doping level with the other wafers being doped to a p⁻ doping level. Wafers A, B and D were not nitrogen doped and wafers E-I were nitrogen doped.

Figure 8:
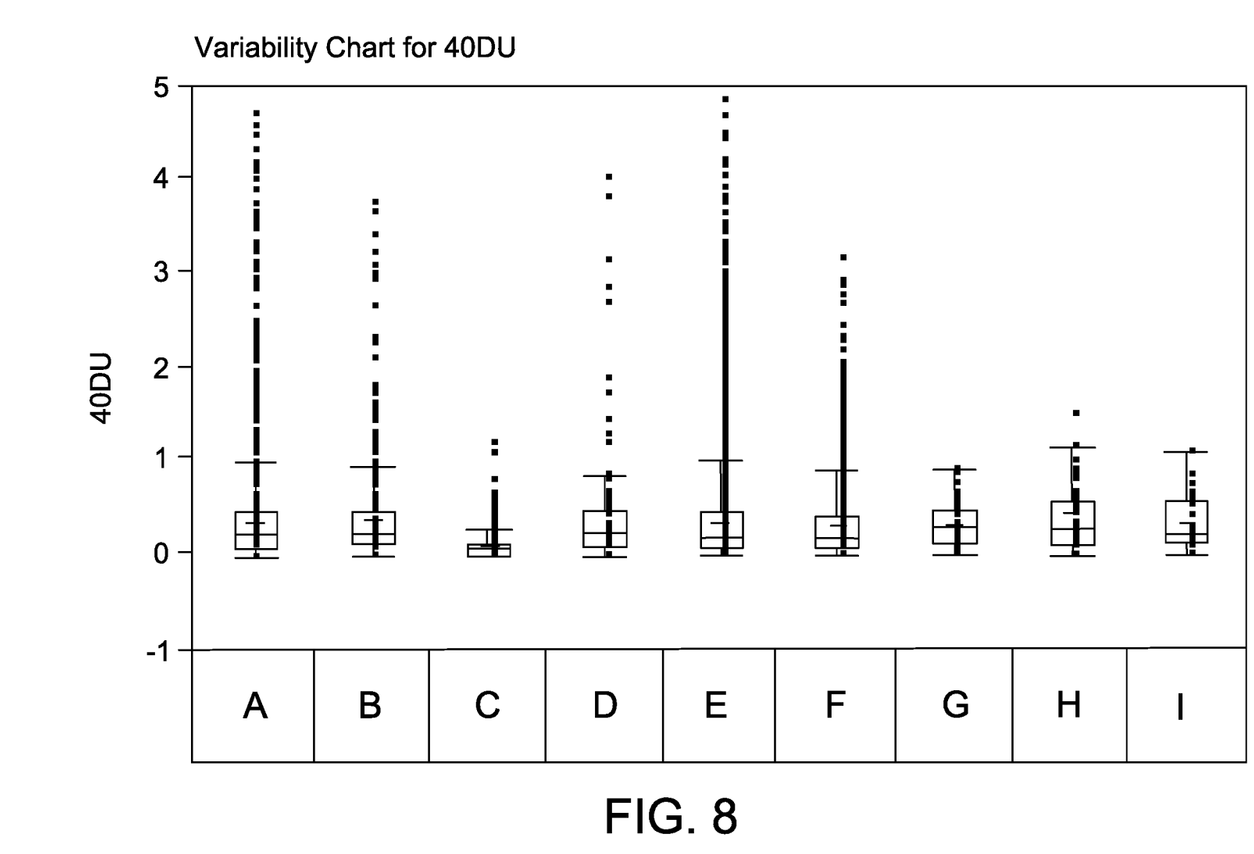
FIG. 8 is a variability plot showing depolarization of various epitaxial wafers during imaging.

A variability chart (40 DU) of the wafers showing the depolarization value is shown in FIG. 8. As shown in FIG. 8, Wafer C had the least variability and the lowest average depolarization.

These results are confirmed from the raw data shown in Table 1 (40 DU being all samples from the wafers A-I):

TABLE 1

Infrared Depolarization Imaging Characterization for Different Epitaxial Wafers

| Wafer | Average | Std Dev | Minimum | Maximum | Scanned tracks |
|---|---|---|---|---|---|
| 40 DU | 0.307888 | 0.679622 | 0 | 78.5 | 42702 |
| A | 0.360771 | 0.578739 | 0 | 16 | 3987 |
| B | 0.385632 | 0.647394 | 0 | 8.6 | 976 |
| C | 0.097544 | 0.286061 | 0 | 10 | 3810 |
| D | 0.464353 | 0.725204 | 0 | 4.02 | 132 |
| E | 0.327613 | 0.483257 | 0 | 29.1 | 26515 |
| F | 0.302907 | 1.257323 | 0 | 78.5 | 7073 |
| G | 0.301007 | 0.209943 | 0 | 0.909 | 111 |
| H | 0.42245 | 0.571042 | 0 | 3.06 | 58 |
| I | 0.317477 | 0.29182 | 0 | 1.08 | 40 |

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for determining suitability of a silicon substrate for epitaxy, the method comprising:
   loading a first silicon substrate onto a susceptor disposed within a processing reactor;
   contacting a front surface of the first silicon substrate with a silicon-containing gas, the silicon-containing gas decomposing to form an epitaxial silicon layer on the first silicon substrate to form a first epitaxial wafer;
   imaging the first epitaxial wafer by infrared depolarization to determine a first infrared depolarization parameter;
   loading a second silicon substrate onto the susceptor disposed within the processing reactor, the second silicon substrate having a different composition than the first silicon substrate;
   contacting a front surface of the second silicon substrate with the silicon-containing gas, the silicon-containing gas decomposing to form an epitaxial silicon layer on the second silicon substrate to form a second epitaxial wafer;
   imaging the second epitaxial wafer by infrared depolarization to determine a second infrared depolarization parameter; and
   determining suitability of the first silicon substrate and the second silicon substrate for epitaxy based on the first and second infrared depolarization parameters.

2. The method as set forth in claim 1 wherein determining suitability of the first silicon substrate and the second silicon substrate for epitaxy comprises comparing the first infrared depolarization parameter to the second infrared depolarization parameter.

3. The method as set forth in claim 2 wherein the first infrared depolarization parameter and the second infrared depolarization parameter are the same parameter.

4. The method as set forth in claim 1 wherein determining suitability of the first silicon substrate and the second silicon substrate for epitaxy comprises determining a slip resistance of the substrates.

5. The method as set forth in claim 1 wherein the first infrared depolarization parameter and second infrared depolarization parameter are each selected from a wafer map, bad fraction variability chart, bad fraction average, total bad fraction, average depolarization value, total of the depolarization value, depolarization contrast, and shear stress equivalent.

6. The method as set forth in claim 1 wherein the first infrared depolarization parameter and second infrared depolarization parameter are related to a depolarization value.

7. The method as set forth in claim 1 wherein the first silicon substrate and the second silicon substrate have a different impurity or dopant concentration.

8. The method as set forth in claim 1 wherein the first silicon substrate and the second silicon substrate have a different concentration of oxygen, nitrogen, carbon or boron.

9. The method as set forth in claim 1 further comprising:
   heat treating the first epitaxial wafer before imaging the first epitaxial wafer; and
   heat treating the second epitaxial wafer before imaging the second epitaxial wafer.

10. The method as set forth in claim 1 wherein the epitaxial silicon layer is formed on the first silicon substrate to form the first epitaxial wafer under the same process conditions at which the epitaxial silicon layer is formed on the second silicon substrate to form the second epitaxial wafer.

11. The method as set forth in claim 1 wherein only an annular edge region of the first and second epitaxial wafers is imaged.

* * * * *